United States Patent
Tasaki et al.

[11] Patent Number: 6,149,975
[45] Date of Patent: Nov. 21, 2000

[54] POTASSIUM-CONTAINING THIN FILM AND PROCESS FOR PRODUCING THE SAME

[75] Inventors: Yuzo Tasaki; Mamoru Satoh, both of Tokyo; Atsushi Onoe, Saitama-ken; Ayako Yoshida, Saitama-ken; Kiyofumi Chikuma, Saitama-ken, all of Japan

[73] Assignees: Dowa Mining Co., Ltd.; Pioneer Electronic Corporation, both of Tokyo, Japan

[21] Appl. No.: 09/265,703

[22] Filed: Mar. 10, 1999

[30] Foreign Application Priority Data

Mar. 30, 1998 [JP] Japan ................................. 10-102077

[51] Int. Cl.$^7$ .................................................... C30B 25/00
[52] U.S. Cl. ...................................... 427/255.32; 117/948
[58] Field of Search ........................ 427/255.31, 255.32, 427/252; 117/948

[56] References Cited

U.S. PATENT DOCUMENTS 5,258,204  11/1993  Wernberg et al. ..................... 427/255
5,904,771  5/1999  Tasaki et al. ............................ 117/105

FOREIGN PATENT DOCUMENTS 10-25576  1/1998  Japan ..................................... 117/105
9504119  2/1995  WIPO .

*Primary Examiner*—Shrive Beck
*Assistant Examiner*—Michael Cleveland
*Attorney, Agent, or Firm*—McDermott, Will & Emery

[57] ABSTRACT

When a potassium-containing substance is formed in to a film using an organic potassium complex as a potassium source by the CVD method, it is prevented that the film formation rate is changed with the lapse of time, and the potassium content in the film thus formed is changed.

As a potassium source for vaporization used for depositing the potassium-containing substance on a substrate by the CVD method, a β-diketone complex of potassium that has been melted by heating to a temperature higher than its melting point and then cooled to be solidified is used.

2 Claims, 3 Drawing Sheets

6,149,975

POTASSIUM-CONTAINING THIN FILM AND PROCESS FOR PRODUCING THE SAME

FIELD OF THE INVENTION

The present invention relates to a potassium-containing thin film and a process for producing the same by a CVD method. More particularly, the invention relates to an improvement of a potassium raw material for vaporization that provides a thin film of a potassium-containing substance having a composition that is useful as an optical device in a stable and high film forming rate.

BACKGROUND OF THE INVENTION

The production of a thin film of a potassium-containing substance has recently been tried, as for example, by a $KNbO_3$ thin film which received attention as an optical device. A $KNbO_3$ single crystal thin film can be used as a wavelength conversion device of a high efficiency with utilizing the high secondary non-linear optical effect of the crystal.

The production technique of a thin film includes physical film formation methods, such as a vacuum vapor deposition method, a sputtering method, and chemical film formation methods, such as a chemical vapor deposition (CVD) method. The CVD method has been widely employed since it is suitable for mass production owing to its controllability of the film formation rate and the film composition, and possibility of film formation at a high rate on a wide area. The CVD method is investigated as a production process of an optical device thin film such as $KNbO_3$.

In the case where a thin film of a potassium-containing substance such as $KNbO_3$ thin film is formed by the CVD method, a process is employed, in which a potassium source (a potassium compound) and a niobium source (a niobium compound) are introduced into a reactor containing a substrate, and $KNbO_3$ is deposited on the surface of the substrate in the presence of a suitable amount of oxygen. As the potassium source, a complex of potassium and dipivaloylmethane, one kind of a β-diketone, can be generally used, and as the niobium source, pentaethoxyniobium can be generally used.

When a thin film of a potassium-containing substance is formed by the CVD method, it is convenient to use an organic potassium complex as the potassium source. Such a complex compound has a high melting point and is generally synthesized in the form of a powder. Therefore, such an organic complex compound is vaporized from a solid state in the form of a powder. According to experiences of the inventors, in such a case, it has been found that the film formation rate is changed (decreased) with the lapse of time, and the potassium distribution in the film is changed to result in a concentration gradient of the potassium content in the film.

SUMMARY OF THE INVENTION

An object of the invention is to conduct vaporization of a potassium source in a stable manner with the lapse of time in the CVD method, so as to provide a potassium-containing thin film having a small concentration gradient of the potassium content.

The invention relates to a process for producing a potassium-containing thin film by a CVD method using a β-diketone complex of potassium as a potassium source for vaporization to deposit a potassium-containing substance on a substrate. The β-diketone complex has been melted by heating to a temperature higher than its melting point and then cooled to be solidified.

According to the process of the invention, a potassium-containing thin film that has a concentration gradient of a potassium content of 0.5%/μm or less is produced.

DETAILED DESCRIPTION OF THE INVENTION

Figure 1:
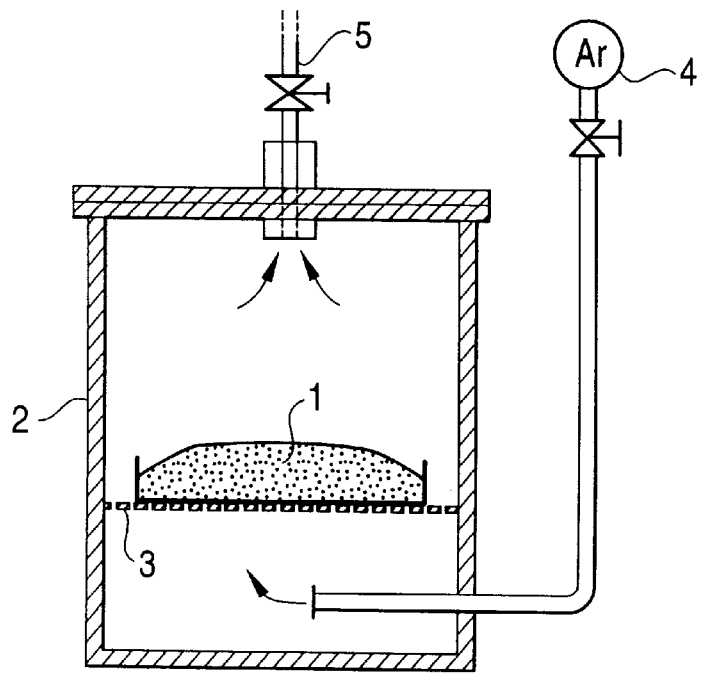
FIG. 1 is a schematic cross sectional view showing a a source material container, where powder of an organic potassium complex is charged in the container.

In order to solve the problems associated with the conventional techniques, the inventors have conducted various experiments and investigations, and as a result, it has been found that stable film formation can be realized to solve the problems by using a β-diketone complex that has been melted by heating to a temperature higher than its melting point and then cooled to be solidified before used as a potassium source for film formation. It may be reasonable to expect that the film formation rate be decreased because the surface area of the complex that has been melted and solidified is greatly decreased in comparison to that in the form of a powder. However, it has been found that the film formation rate of the β-diketone complex of potassium is increased contrary to the expectation. Furthermore, the complex that has been melted and solidified has an advantage in that the film formation can be stably conducted for a long period of time because it has a small decreasing rate of the surface area due to decrease in the amount of the complex with the lapse of time.

The potassium source used in the invention is a β-diketone complex, and the production process of the complex powder can be roughly classified into a hydrous phase synthesis method and an anhydrous phase synthesis method. It has been found that a powder obtained by the anhydrous phase synthesis method is suitable for the invention. In the case where the complex is melted by heating to a temperature higher than its melting point, the complex obtained by the hydrous phase synthesis method suffers thermal decomposition, whereas the complex obtained by the anhydrous phase synthesis method is difficult to be thermally decomposed.

In order to produce a β-diketone complex of potassium by the anhydrous phase synthesis method, for example, metallic potassium may be reacted with dipivaloylmethane or 2,2,6,6-tetramethyl-3,5-octanedione in anhydrous toluene. According to the reaction, a powder of an organic potassium complex is obtained, which contains dipivaloylmethane or 2,2,6,6-tetramethyl-3,5-octanedione as a ligand of potassium (K).

In practicing the invention, the organic potassium complex powder thus obtained is melted by heating in an inert gas atmosphere, and then cooled to be solidified, to be used as a potassium source for the CVD method. At this time, it is the most convenient procedure in that the powder is charged in a container of a source material, the powder contained in the container is heated to a temperature higher than its melting point in an inert gas atmosphere, it is then cooled to be solidified in the container, and the solidified material is used as a source material for the film formation process.

A potassium-containing thin film having a small concentration gradient of a potassium content can be obtained by using the β-diketone complex of potassium that has been melted by heating to a temperature higher than its melting point and then cooled to be solidified, as a source material for forming the potassium-containing thin film. That is, by using such a complex, the change in potassium content within the period from the beginning of deposition to the end of deposition becomes small, and as a result, for example, a potassium-containing thin film with an extremely uniform composition having a concentration gradient of a potassium content in the direction of deposition of 0.5%/$\mu$m or less, preferably 0.1%/$\mu$m or less, more preferably 0.02%/$\mu$m or less, assuming that the potassium content at the beginning of deposition is 100%.

The invention will be described in detail with reference to the drawings.

FIG. 1 shows the state, in which powder of an organic potassium complex 1 charged in a dish (source material holder) is set in a source material container 2 for film formation, in such a manner that the dish, in the horizontal direction, is placed on a porous plate 3. The interior of the container 2 is substituted with an inert gas, which may be conducted by introducing an inert gas from an Ar gas or $N_2$ gas source 4 to the bottom part of the container 2, and exhausting the same from an exhaust pipe 5 at the upper part of the container 2. The container 2 is heated to a temperature higher than the melting point of the powder and then cooled, and thus a solidified body 6 in the form of a plate or a film of the organic potassium complex in the dish is obtained as shown in FIG. 2.

Figure 2:
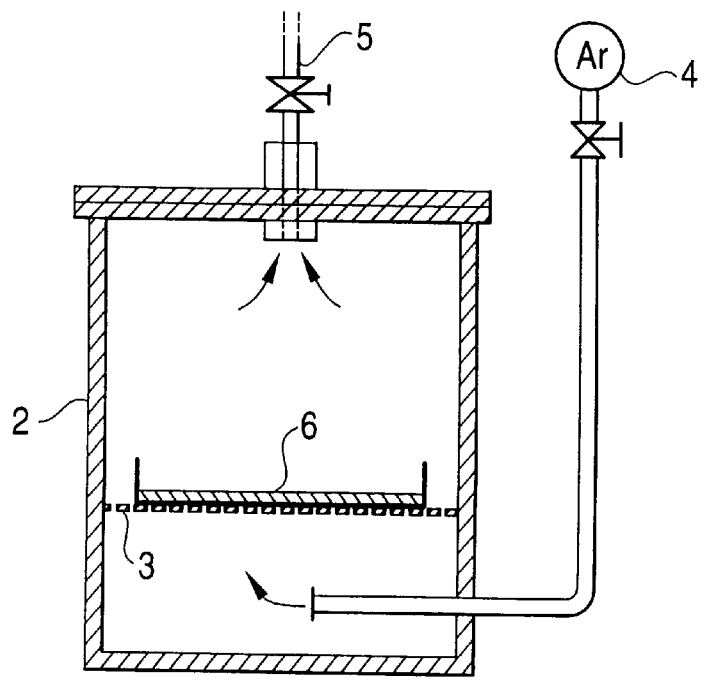
FIG. 2 is a schematic cross sectional view showing a a source material container, where an organic potassium complex that has been melted and solidified is charged in the container.
Figure 3:
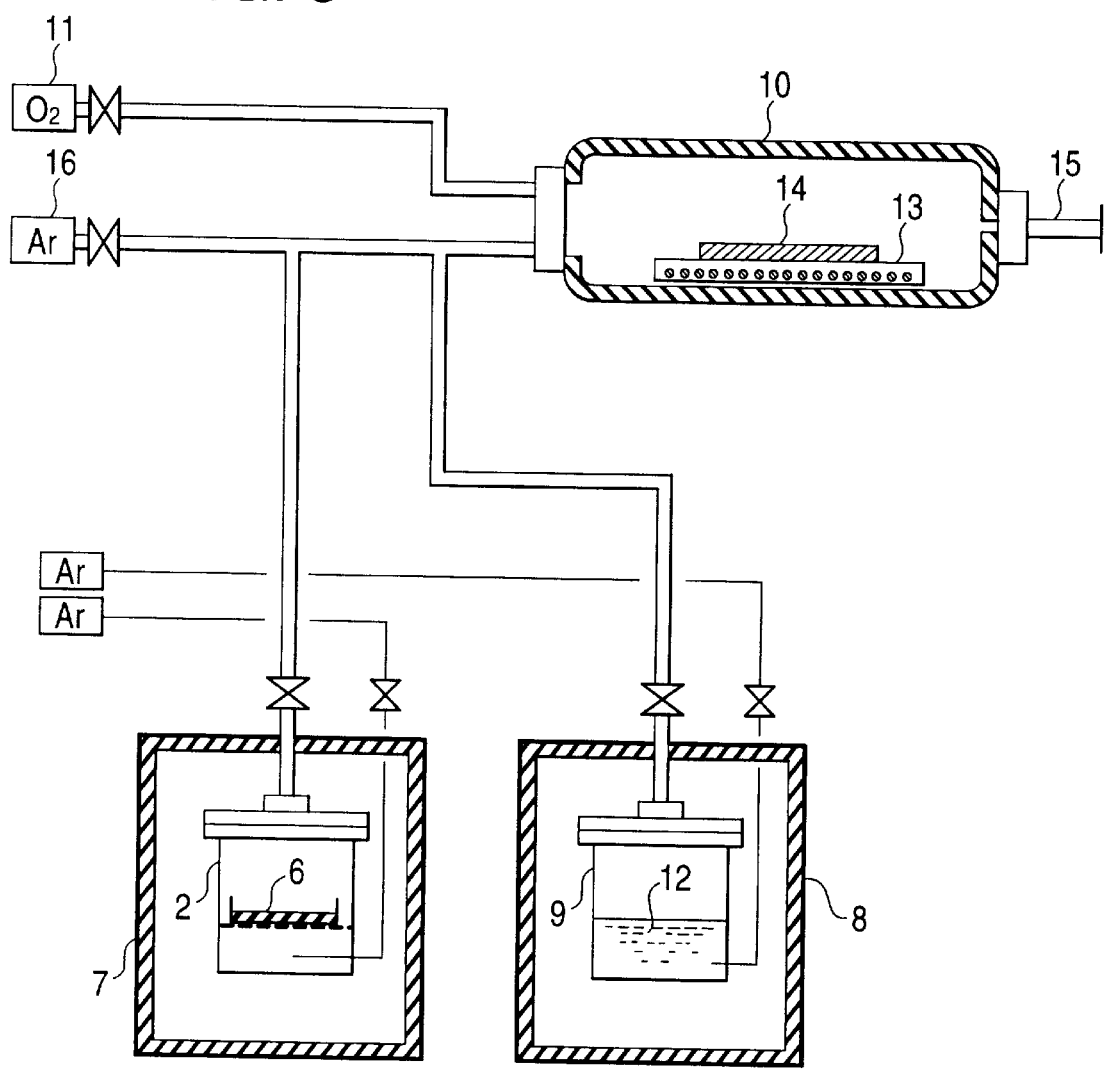
FIG. 3 is a diagram showing an example of arrangement of devices of a film formation apparatus.

FIG. 3 shows the whole arrangement of the film formation apparatus, in which the source material container 2 for film formation in the state of FIG. 2 is set in one source material furnace 7 of the film formation apparatus. The film formation apparatus comprising the source material furnace 7 and a source material furnace 8 is for using two source materials. In the case where three or more source materials are used, a suitable number of source material furnaces may be added. The example shown in FIG. 3 has a constitution in that the source material container 2 for the organic potassium complex that has been solidified is set in the source material furnace 7, and a source material container 9 for a niobium compound, for example, is set in the source material furnace 8. By heating the source material furnaces 7 and 8 to a prescribed temperature, the source materials are vaporized to introduce them vapor into a reactor 10 using Ar gas as a carrier, and a prescribed amount of oxygen is introduced from an oxygen source 11 to the reactor 10.

In the case where a niobium compound is vaporized from the other source material furnace 8, pentaethoxyniobium 12 is charged in the source material container 9. Since this compound has a low melting point, it is heated to a temperature higher than its melting point and is vaporized from the liquid state.

A susceptor 13 to be subjected to high frequency heating is provided in the reactor 10, and a substrate 14 is placed on the susceptor 13. The vapor of the organic potassium complex, the vapor of pentaethoxyniobium and oxygen gas as introduced in the reactor 10 are reacted on the surface of the substrate 14 (e.g., a silicon single crystal) maintained at a prescribed temperature, and thus a $KNbO_3$ film is deposited. A waste gas pipe 15 is connected to the reactor 10, and a waste gas is forcedly exhausted from the waste gas pipe 15 to maintain the interior of the reactor at a reduced pressure. A heating jacket with a heater is provided on piping connecting the source material containers 2 and 9 and the reactor 10, so that the temperature of its inner wall is maintained at a temperature higher than the temperature of the source material furnaces, and thus the source material is prevented from depositing on the inner wall of the piping.

Figure 4:
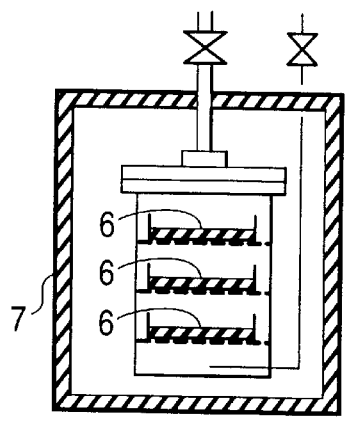
FIG. 4 is a schematic cross sectional view showing a source material furnace equipped with a source material container, in which an organic potassium complex that has been melted and solidified is equipped in a multistage mode.

FIG. 4 shows an example, in which an organic potassium complex, that has been melted and solidified in the dish, is equipped in a multistage mode in the source material container. By setting solidified layers 6 of the organic potassium complex in a multistage mode, its vaporization area can be increased.

While FIGS. 1 to 4 show the example where powder of an organic potassium complex is solidified in a dish, and a solidified body in the form of a film is vaporized, the shape of the organic potassium complex may not be in the form of a film or a plate, provided it has been melted and solidified, the complex that has been melted and solidified may be pulverized upon use. The solidified body that has been coarsely crashed and then finely pulverized can increase and stabilize the film formation rate, as different from the starting powder of the source material.

As shown in the Examples described later, in the case where the organic potassium complex is vaporized from the starting powder, particles of the powder adhere to each other with the lapse of time, to change into the state where the powder as a whole is tightened to a firm assembly. In the case where the complex that has been melted by heating and then solidified is used, on the other hand, such a change in the state does not occur. Even when the solidified complex is crashed or pulverized into a general powder form, such a change in the state does not occur. Due to these reasons, in the invention, the film forming rate is increased and stabilized in comparison to the case where the starting powder is vaporized.

An example of the invention will be described below, in which a film of $KNbO_3$ (K—Nb—O compound) is formed on a silicon substrate by using an apparatus shown in FIG. 3. As a potassium source, an organic potassium complex (K(DPM)) containing dipivaloylmethane as a ligand of K, which is obtained by reacting metallic potassium and dipivaloylmethane in dehydrated toluene, is used. As a niobium source, $Nb(OC_2H_6)_5$ (pentaethoxyniobium) is used. The former K(DPM) is vaporized from the solid state since it has a high melting point, and the later Nb compound is vaporized from the liquid state since it has a low melting point.

EXAMPLE 1

10 g of K(DPM) powder was charged in a stainless steel dish and sealed in a source material container 2 in an inert gas atmosphere, as shown in FIG. 1. A treatment was conducted, in which the container was heated to a temperature higher than the melting point of the powder, and then cooled to room temperature. The source material, after the treatment, was formed on the dish as a solidified layer 6 in the form of a film having a thickness of about 1 mm, as shown in FIG. 2. The source material container 2 was set in a source material furnace 7, as shown in FIG. 3. The dish was supported by a porous plate 3 comprising a stainless steel, through which a large number of pores are formed, to make passage of the carrier gas easy. A Nb source material 12 was charged in another source material container 9 in an inert gas atmosphere, and it was set in a source material furnace 8 different from the potassium source material described above, as shown in FIG. 3.

The temperature inside the furnace 7 for the potassium source was controlled to about 185° C., and the temperature inside the furnace 8 for the niobium source was controlled to about 110° C. Ar gas, as a carrier gas, was passed through the source material containers 2 and 9, so as to generate a mixed gas of a source material gas and the carrier gas from the source material containers 2 and 9. The flow amount of a main carrier gas 16 (Ar) was controlled to make the total flow amount of the total gas introduced into reactor 10 to 2,200 SCCM. Oxygen gas was mixed with the mixed gas immediately before the reactor 10 to make the total oxygen gas flow amount to 50% of the total flow amount, so as to introduced into the reactor 10, and a $KNbO_3$ film was grown on a substrate 14 in the reactor 10. As the substrate, an Si (111) substrate having a thickness of 0.5 mm was used.

At this time, the substrate 14 was set on a susceptor 13, and the temperature of the substrate 14 was maintained to 850° C. by subjecting the susceptor 13 to high frequency heating. On piping connecting from the source material containers 2 and 9 to the reactor 10, a ribbon heater was attached to maintain the temperature of the inner wall of the piping higher than the temperature of the source material furnaces 7 and 8, so as to prevent solidification of the source material. The reactor 10 was forcedly evacuated by an evacuating pump, so that the inside of the reactor was at a reduced pressure. The flow amount of the Ar carrier gas was maintained constant during the film formation at 500 SCCM for K(DPM) and 25 SCCM for $Nb(OC_2H_5)_5$.

COMPARATIVE EXAMPLE 1

The same procedures as in Example 1 were repeated except that 10 g of K(DPM) powder was not subjected to a treatment in that it was heated to a temperature higher than the melting point, followed by cooling, but was used in the form of source material powder for film formation.

Figure 5:
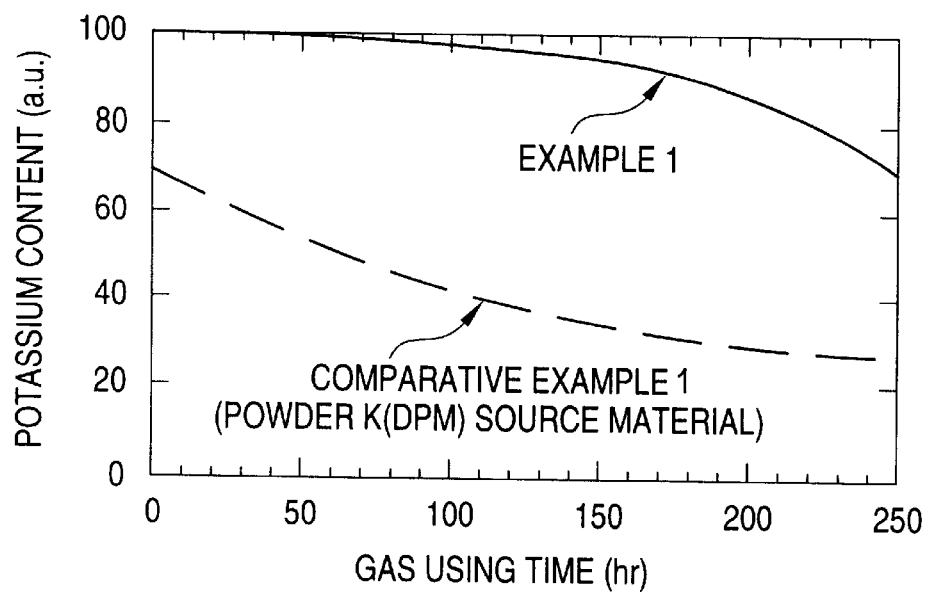
FIG. 5 is a graph showing the relationship between the film formation time (gas using time) and the potassium content in the film in Example 1 and Comparative Example 1.

FIG. 5 shows a result of investigation of the relationship between the treating time (gas using time (hr)) and the potassium content in the film thus formed with repeatedly conducting Example 1 and Comparative Example 1 with varying the end point of film formation. The potassium content as the ordinate of FIG. 5 is expressed in terms of relative values (arbitrary unit (a.u.)) assuming that the maximum value of the potassium content be 100.

It can be understood from the results shown in FIG. 5 that when the vaporization is conducted from the source material, that has been melted and solidified as in Example 1, the potassium content in the film is increased and the high potassium content can be maintained for a long period of time, in comparison to the case where the starting powder is vaporized in the Comparative Example 1. Accordingly, in Comparative Example 1, the vaporization rate of K(DPM) is suddenly decreased with the increase of the time using the source material, and the potassium content in the film is decreased. In Example 1, on the other hand, the high vaporization rate is maintained from the initial stage for a long period of time, and thus stable and high-speed vaporization rates can be realized.

The concentration gradient of the potassium content in the film obtained at the time when the gas using time was 100 hours in FIG. 5 was 0.5%/μm or less in Example 1 and about 2.5%/μm in Comparative Example 1.

In both Example 1 and Comparative Example 1, after the film formation rate is decreased, the source material container was opened to observe the inside. In Example 1, the solidified film layer was uniformly thinned, and a part where the stainless steel part of the dish was partly exposed was observed. In Comparative Example 1, on the other hand, the source material powder was changed to an unified coarse assembly without maintaining the original powder form, and the whole was tightened to a firm assembly.

Accordingly, it is considered that in the source material obtained by subjecting K(DPM) powder to a treatment of melting and solidifying as in Example 1, its surface area is extremely decreased in comparison to that in the form of a starting powder, but the vapor pressure becomes larger than that in the form of a starting powder, and the surface area in contact with the carrier gas is not changed with the lapse of time (i.e., even when the volume is decreased by consumption, the surface area is maintained to a substantially constant value). Thus, the vaporization amount becomes large, and the fluctuation of the vaporization amount becomes small. On the other hand, it is considered that when the source material powder of K(DPM) is used as in Comparative Example 1, the vapor pressure becomes relatively low, and it is considered that the contact area to the carrier gas is decreased and the film forming rate is also decreased, by such reasons that the partial adhesion of the particles and the recrystallization from the vapor of the source material would proceed with the lapse of time, thereby producing an unified coarse assembly which would reduce the whole surface area than that of the starting powder.

EXAMPLE 2

As shown in FIG. 4, K(DPM) solidified film layers that had been subjected to the melting and solidifying treatment in the same manner as in Example 1 were provided in three stages in the source material container 2, wherein the K(DPM) in each stage was 10 g, and 30 g in total was used as a potassium source, and the operations of film formation were conducted in the same manner as in Example 1. At this time, the flow amount of the carrier gas passing inside the source material container 2 was changed, and the carrier flow amount and the potassium content in the film thus obtained were measured. The flow amount of the carrier gas passing in the source material container 9 of the niobium source was maintained at a constant value of 25 SCCM, and the total flow amount introduced into the reactor 10 is controlled to a constant value of 2,200 SCCM by relatively controlling the flow amount of the main carrier gas 16 for introducing the mixed gas into the reactor 10, also the oxygen concentration in the reactor 10 was maintained at a constant value of 50%.

Similarly, in the treatment in Example 1, where a solidified film layer of K(DPM) was provided in one stage, the potassium contents of the carrier gas and the film were investigated with changing the flow amount of the carrier gas passing through the source material container 2. In this case, the flow amount of the carrier gas into the source material container 9, the total flow amount to the reactor, and the oxygen concentration in the reactor were made constant to the values described above.

Figure 6:
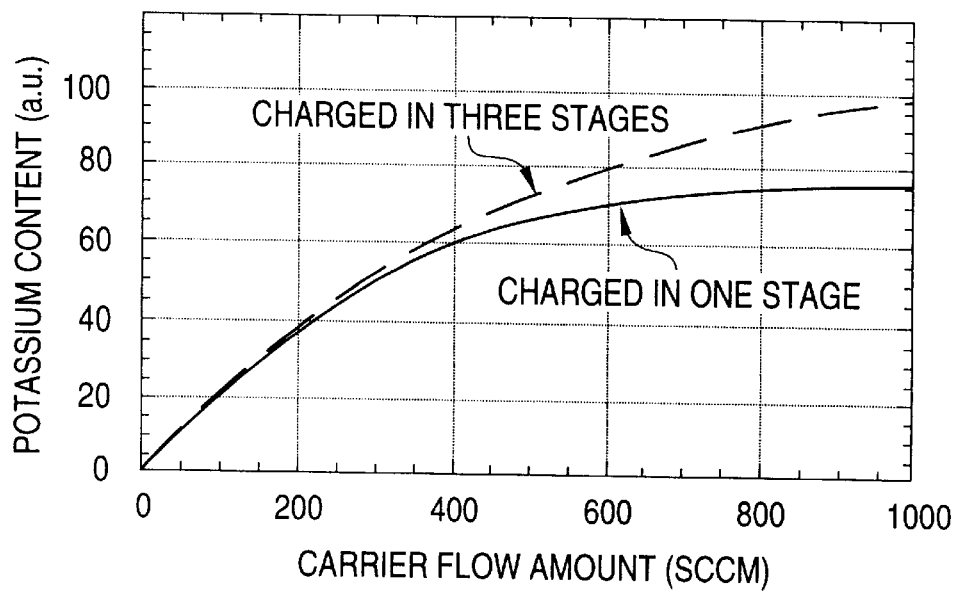
FIG. 6 is a graph showing the relationship between the carrier flow amount and the potassium content in the film in the case where the organic potassium complex that has been melted and solidified is equipped in the a source material container in three stages, and the case where it is equipped in one stage.

FIG. 6 shows the relationship between the carrier flow amount passing in the source material container 2 and the potassium content in the film thus obtained, in both cases. It is understood from the results shown in FIG. 6 that as compared with the case of one stage, in the case where the source material is in three stages, even when the flow amount of the carrier gas is increased, the potassium content in the film becomes relatively high. It can be considered that this is because that the area in contact with the carrier gas becomes relatively large.

EXAMPLE 3

10 g of K(DPM) powder source material was melted and solidified in the same manner as in Example 1, and the solidified body was taken out from the dish, followed by cracking it into pieces, like particles of a granulated sugar, under a nitrogen gas atmosphere. All the particles was again charged in the dish and then set in the source material container 2, and the relationship between the flow amount of the carrier gas and the potassium content in the film thus formed was investigated with changing the flow amount of the carrier gas passing in the source material container 2, in the same manner as in Example 2. As a result, it was confirmed that in the source material in this example that had been subjected to the crushing treatment, the potassium content becomes relatively high even when the flow amount of the carrier gas was increased. It can be considered that this is because the area in contact with the carrier gas becomes larger by conducting the crushing treatment.

EXAMPLE 4

10 g of K(DPM) in the form of the crushed particles as in Example 3 was further pulverized under a nitrogen atmosphere to be in a powder form, and the film formation of $KNbO_3$ was conducted in the same manner as in Example 1. When the potassium content of the film thus obtained was measured, it was confirmed that the potassium content in the film became relatively high in comparison to Comparative Example 1.

As explained in the foregoing, according to the invention, when a potassium-containing substance is deposited on a substrate by the CVD method, the vaporization of the β-diketone complex of potassium used as a potassium source can be effectively conducted in a stable manner with the lapse of time. Accordingly, a potassium-containing thin film with excellent quality can be stably produced at a high film forming rate.

What is claimed is:

1. A process for producing a potassium-containing thin film by a CVD method, the method comprising the sequential steps of:

melting a β-diketone complex of potassium by heating it to a temperature higher than its melting point;

cooling the melted complex to be solidified;

pulverizing the solidified complex to a powder; and evaporating the pulverized complex to deposit a potassium-containing substance on a substrate.

2. A process for producing a potassium-containing thin film by a CVD method, the method comprising the sequential steps of:

forming a β-diketone complex of potassium by reacting potassium with dipivaloylmethane or 2,2,6,6-tetramethyl-3,5-octanedione in an anhydrous solvent;

melting the β-diketone complex of potassium by heating it to a temperature higher than its melting point;

cooling the melted complex to be solidified;

pulverizing the solidified complex to a powder; and evaporating the pulverized complex to deposit a potassium-containing substance on a substrate.

* * * * *